US011876021B2

(12) United States Patent
Kiribuchi et al.

(10) Patent No.: US 11,876,021 B2
(45) Date of Patent: Jan. 16, 2024

(54) TEST CIRCUIT AND TEST METHOD

(71) Applicants: KABUSHIKI KAISHA TOSHIBA, Minato-ku (JP); Kioxia Corporation, Minato-ku (JP)

(72) Inventors: Daiki Kiribuchi, Katsushika (JP); Takeichiro Nishikawa, Yokohama (JP); Hidetaka Eguchi, Ota (JP)

(73) Assignees: KABUSHIKI KAISHA TOSHIBA, Minato-ku (JP); Kioxia Corporation, Minato-ku (JP)

( * ) Notice: Subject to any disclaimer, the term of this patent is extended or adjusted under 35 U.S.C. 154(b) by 424 days.

(21) Appl. No.: 16/818,264

(22) Filed: Mar. 13, 2020

(65) Prior Publication Data
US 2020/0373207 A1 Nov. 26, 2020

(30) Foreign Application Priority Data
May 23, 2019 (JP) .................................. 2019-097006

(51) Int. Cl.
*H01L 21/66* (2006.01)
*G05B 19/418* (2006.01)

(52) U.S. Cl.
CPC ........ *H01L 22/10* (2013.01); *G05B 19/41875* (2013.01); *H01L 22/20* (2013.01); *H01L 22/30* (2013.01); *G05B 2219/45031* (2013.01)

(58) Field of Classification Search
None
See application file for complete search history.

(56) References Cited

U.S. PATENT DOCUMENTS 7,047,095 B2    5/2006   Tomoyasu

FOREIGN PATENT DOCUMENTS

| JP | 6-301690 A | 10/1994 | |
|---|---|---|---|
| JP | 3485093 B2 | 1/2004 | |
| JP | 2009-170502 A | 7/2009 | |
| JP | 2010-81805 A | 4/2010 | |
| JP | 2010-225821 A | 10/2010 | |
| JP | 2011221642 A * | 11/2011 | ............ Y02P 90/02 |
| JP | 4869551 B2 | 2/2012 | |

OTHER PUBLICATIONS

JP 2009122767A, Device for Creating Control Chart, Method and Program, Shimazu Yasuhara, Jun. 4, 2009. (Year: 2009).*

* cited by examiner

*Primary Examiner* — Alexander G Ghyka
(74) *Attorney, Agent, or Firm* — Oblon, McClelland, Maier & Neustadt, L.L.P.

(57) ABSTRACT

A manufacturing control apparatus has an acquiring part that acquires past manufacturing data in which a target value of an output value of the intermediate product, the output value of the intermediate product, and quality of a final product produced from the manufacturing apparatus are associated with one another, an output predicting part that predicts, based on the target value of the intermediate product and the output value of the intermediate product in the past manufacturing data, the output value of the intermediate product for each of possible target values of the intermediate product, and a quality predicting part that predicts, based on the output value of the intermediate product and the quality of the final product in the past manufacturing data, the quality of the final product from a predicted value of the output value of the intermediate product for each of the predicted possible target values.

8 Claims, 8 Drawing Sheets

| FINAL PRODUCT | TARGET VALUE | OUTPUT VALUE | QUALITY |
|---|---|---|---|
| 1 | 33 | 32.4 | 0.35 |
| 2 | 33 | 33.4 | 0.42 |
| 3 | 36 | 35.8 | 0.87 |
| 4 | 36 | 37.2 | 0.64 |
| ⋮ | ⋮ | ⋮ | ⋮ |

FIG. 3

| POSSIBLE TARGET VALUE | EXPECTED VALUE OF QUALITY | RISK IN QUALITY |
|---|---|---|
| 31 | 0.23 | 0.18 |
| 32 | 0.41 | 0.14 |
| 33 | 0.36 | 0.08 |
| ⋮ | ⋮ | ⋮ |
| 39 | 0.14 | 0.21 |

FIG. 4

TEST CIRCUIT AND TEST METHOD

CROSS REFERENCE TO RELATED APPLICATIONS

This application is based upon and claims the benefit of priority from the prior Japanese Patent Application No. 2019-97006, filed on May 23, 2019, the entire contents of which are incorporated herein by reference.

FIELD

An embodiment of the present invention relates to a manufacturing control apparatus, a manufacturing control method, and a program.

BACKGROUND

Modern semiconductor manufacturing apparatuses have a complicated manufacturing process, and thus a final product is produced through a large number of manufacturing processes. Quality such as a size or property of the final product is predetermined, and whether the final product has desired quality can be checked by, for example, an inspection apparatus.

However, quality such as a size or property of an intermediate product produced in each of the large number of manufacturing processes until the final product is produced may not be predetermined. For this reason, when poor in quality of the intermediate product produced in one of the large number of manufacturing processes prevents the quality of the final product from satisfying a predetermined standard, it may take some time to identify which of the manufacturing processes has a problem. Further, when the quality of the intermediate product produced in each manufacturing process is not guaranteed, the yield of the final product may not increase.

BRIEF DESCRIPTION OF THE DRAWINGS

FIG. 3 is a diagram showing an example of history information acquired by an acquiring part;

FIG. 4 is a diagram showing a correspondence among a possible target value, an expected value of a final product, and a risk in the final product;

DETAILED DESCRIPTION

According to one embodiment, a manufacturing control apparatus that controls an output value of an intermediate product produced in a plurality of manufacturing processes of a manufacturing apparatus, the manufacturing control apparatus includes:

an acquiring part configured to acquire past manufacturing data in which a target value of an output value of the intermediate product, the output value of the intermediate product, and quality of a final product produced from the manufacturing apparatus are associated with one another;

an output predicting part configured to predict, based on the target value of the intermediate product and the output value of the intermediate product in the past manufacturing data, the output value of the intermediate product for each of possible target values of the intermediate product; and a quality predicting part configured to predict, based on the output value of the intermediate product and the quality of the final product in the past manufacturing data, the quality of the final product from a predicted value of the output value of the intermediate product for each of the possible target values predicted by the output predicting part.

A description will be given below of embodiments of a manufacturing control apparatus with reference to the drawings. The following mainly describes primary components of the manufacturing control apparatus, but the manufacturing control apparatus may have a component or function that is not shown or described. The following description is not intended to exclude the component and function that is not shown or described.

First Embodiment

Figure 1:
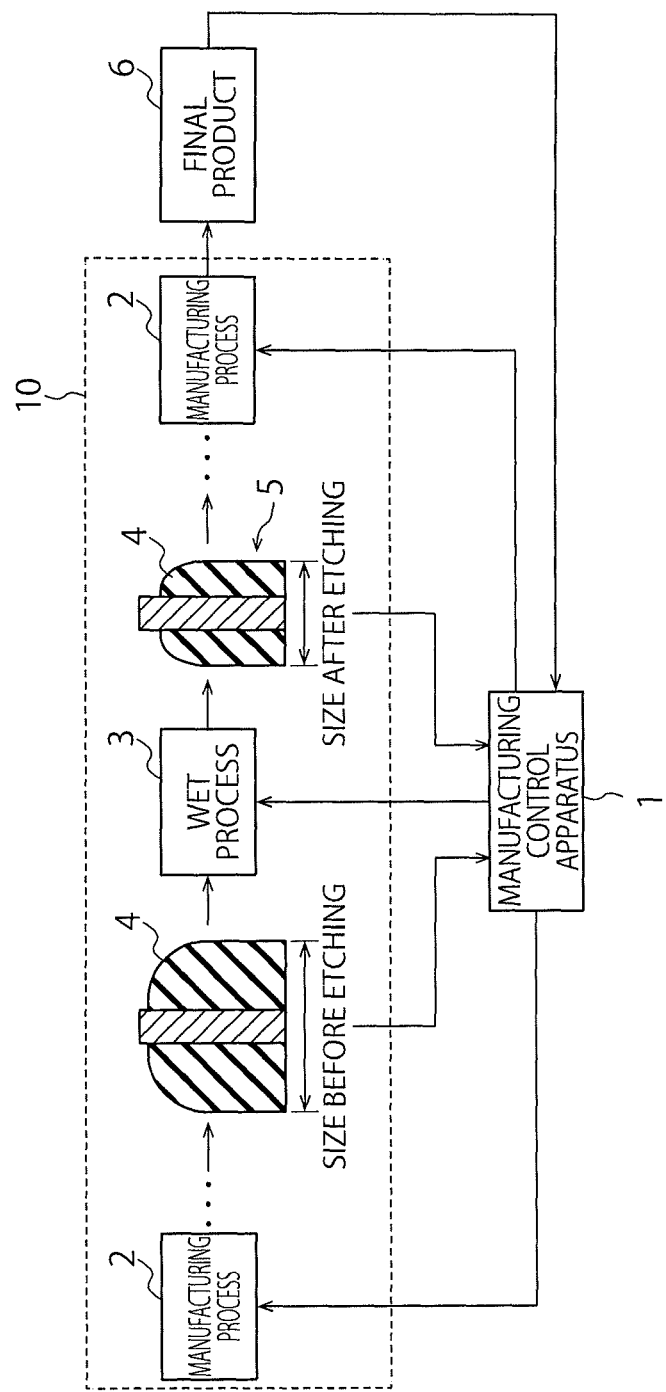
FIG. 1 is a diagram schematically showing a manufacturing control apparatus according to a first embodiment.

FIG. 1 is a diagram schematically showing a manufacturing control apparatus 1 according to a first embodiment. FIG. 1 shows, as an example, the manufacturing control apparatus 1 that controls a semiconductor manufacturing apparatus 10. The semiconductor manufacturing apparatus 10 shown in FIG. 1 finally manufactures a semiconductor device having a desired shape and size through a large number of manufacturing processes 2. One of the large number of manufacturing processes 2 includes, for example, an etching process (hereinafter, an ETG process) 3. In the ETG process 3, for example, a to-be-etched layer 4 formed on a substrate is partially removed by wet etching to reduce (slim) a size of the to-be-etched layer 4. An object manufactured in one of the manufacturing processes 2 such as the ETG process 3 is referred herein to as an intermediate product 5. One or a plurality of manufacturing processes 2 are left even after the ETG process 3, the intermediate product 5 is manufactured in each of the manufacturing processes 2, and a semiconductor device is finally produced. A product in a final form manufactured by the plurality of manufacturing processes 2 is referred herein to as a final product 6. Here, the product may be the above-described semiconductor device, a metal component, a motor, a battery, or the like. That is, the products according to the present embodiment are various manufactured products produced through processing raw materials.

According to the present embodiment, for example, control is performed to make an output value such as a size of the intermediate product 5 subjected to the ETG process 3 closer to a predetermined target value. This is intended to increase the quality such as a size or property of the final product 6. The quality according to the present embodiment is a result of inspecting whether the product has an initial failure or an indicator for determining the quality of the product such as a product yield. In the manufacturing apparatus, it is necessary to perform processes with a plurality of processing apparatuses to increase the quality.

Note that the size, property, or the like of the final product 6 are mainly referred to as quality, but may also be referred to as workmanship herein. The size that is one indicator of the quality of the final product 6 is a value resulting from measuring the shape or size of the final product 6. Further, the property that is another indicator of the quality of the final product 6 corresponds to various properties of the final product 6, such as electrical properties, physical properties, and chemical properties.

The processing apparatus are often coupled with a control apparatus. The control apparatus controls a processing condition of each processing apparatus to make a processing result of the processing apparatus closer to a predetermined target value. Herein, the processing result of the processing apparatus is referred to as an output value of the processing apparatus, and a target output value of the processing apparatus is referred to as a target value. Further, the control apparatus that controls the processing apparatuses is referred herein to as a manufacturing control apparatus 1.

With reference to FIG. 1, a description has been given of the example where the semiconductor device is manufactured by the semiconductor manufacturing apparatus 10, but the manufacturing control apparatus 1 according to the present embodiment is applicable to an apparatus that controls various manufacturing apparatuses other than the semiconductor manufacturing apparatus 10. That is, the manufacturing control apparatus 1 according to the present embodiment is widely applicable to an apparatus that controls a plurality of manufacturing apparatuses that generate the final product 6 through the plurality of manufacturing processes 2.

Figure 2:
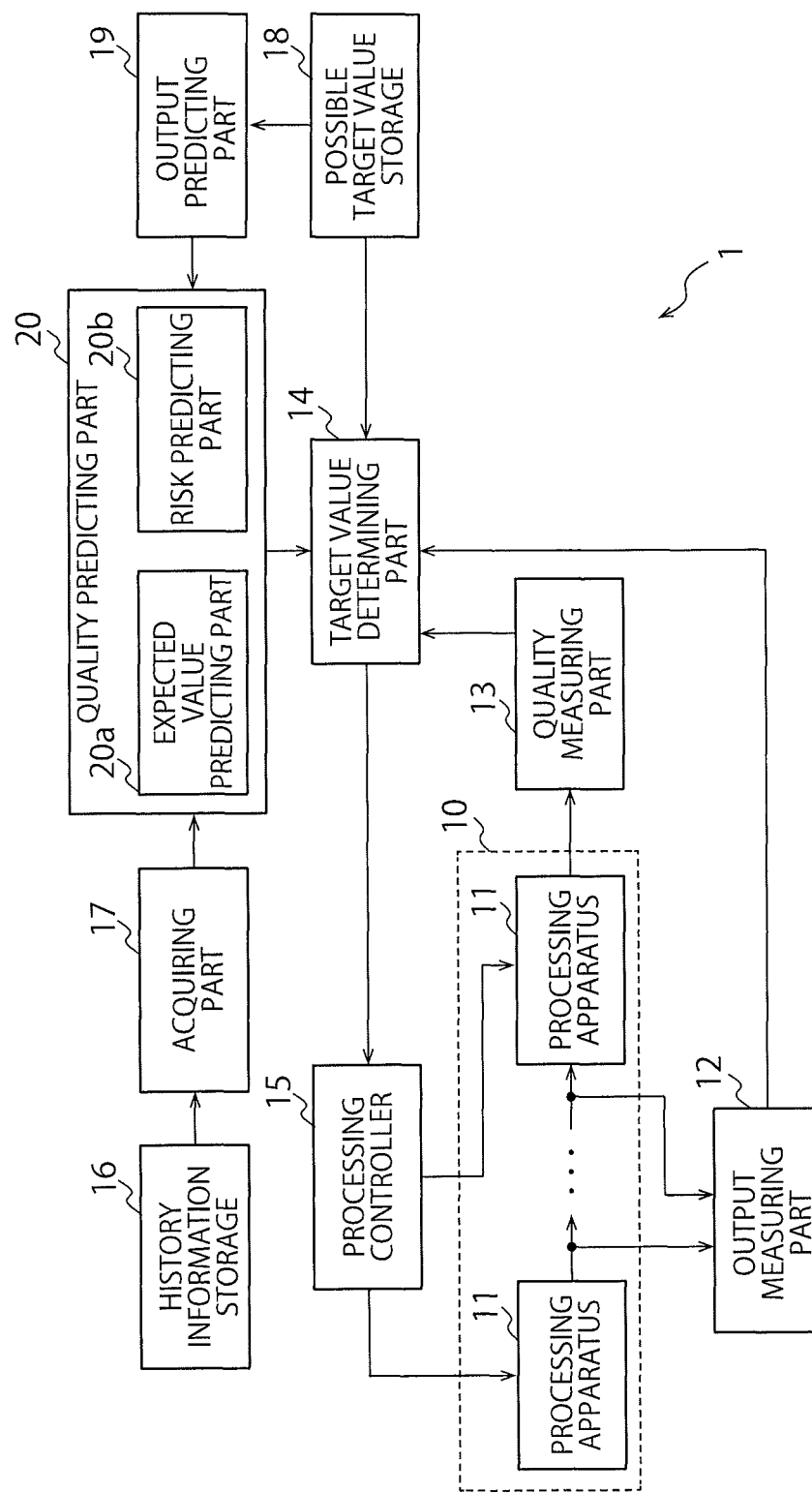
FIG. 2 is a block diagram showing a schematic structure of a manufacturing control apparatus according to one embodiment.

FIG. 2 is a block diagram showing a schematic structure of the manufacturing control apparatus 1 according to one embodiment. The manufacturing control apparatus 1 shown in FIG. 2 is configured to control a manufacturing apparatus (for example, a semiconductor manufacturing apparatus) 10 including a plurality of processing apparatuses 11. The manufacturing apparatus 10 sequentially processes a raw material such as a semiconductor wafer by using the plurality of processing apparatuses 11 to generate the final product 6. The plurality of processing apparatuses 11 are a group of apparatuses to be used to sequentially process the raw material in the plurality of manufacturing processes 2.

The manufacturing control apparatus 1 shown in FIG. 2 includes an output measuring part 12, a quality measuring part 13, a target value determining part 14, a processing controller 15, a history information storage 16, an acquiring part 17, a possible target value storage 18, an output predicting part 19, and a quality predicting part 20. Among the components, the acquiring part 17, the output predicting part 19, and the quality predicting part 20 are essential components of the manufacturing control apparatus 1, and the other components are optional components.

The output measuring part 12 measures an output value of the intermediate product 5 processed by each of the processing apparatuses 11. The output value of the intermediate product 5 is a numerical value resulting from converting the size, property, or the like of the intermediate product 5 into a numerical form. The quality measuring part 13 measures the quality such as the size or property of the final product 6 finally manufactured by the manufacturing apparatus 10. The quality of the final product 6 measured by the quality measuring part 13 is, for example, a numerical value.

The target value determining part 14 determines the target value such as the size or property of the intermediate product 5 processed by each of the processing apparatuses 11, as described later in detail. The target value of the intermediate product 5 is a numerical value resulting from converting the size, property, or the like of the intermediate product 5 into a numerical form.

As described above, the present embodiment is characterized in that the output value of the intermediate product 5 manufactured in each of the manufacturing processes 2 is controlled to be closer to the target value.

The processing controller 15 controls the plurality of processing apparatuses 11 based on the target value of the intermediate product 5 determined by the target value determining part 14. Specifically, the processing controller 15 controls a processing condition of each of the processing apparatuses 11.

The history information storage 16 stores past history information in which each target value of the intermediate product 5 used by the processing controller 15 to control the plurality of processing apparatuses 11, each output value of the intermediate product 5, and the quality of the final product 6 are associated with each other. For example, each time the target value of the intermediate product 5 is changed, the history information storage 16 may newly store the above-described history information.

The acquiring part 17 acquires past manufacturing data in which the target value of the intermediate product 5, the output value of the intermediate product 5, and the quality of the final product 6 from the manufacturing apparatus 10 are associated with each other based on the history information stored in the history information storage 16. Note that past manufacturing data acquired by the acquiring part 17 need not necessarily be the history information stored in the history information storage 16, but may be history information input by a user through an input part (not shown). Alternatively, the acquisition may be made through execution of a program for acquiring the history information.

FIG. 3 is a diagram showing an example of the history information to be acquired by the acquiring part 17. As shown in the example in FIG. 3, the history information in which an identification number of the final product 6, the target value of the intermediate product 5, the output value of the intermediate product 5, and the quality of the final product 6 are associated with each other is acquired. Note that information constituting the history information may be of any type, and the information shown in FIG. 3 is merely an example.

The possible target value storage 18 stores a possible target value of the intermediate product 5. The possible target value is a candidate for changing the target value of the intermediate product 5 and is prestored in the possible target value storage 18. The above-described target value determining part 14 determines the target value of the intermediate product 5 from a plurality of the possible target values based on a predicted value of the quality of the final product 6 for each of the plurality of possible target values. As in an example shown in FIG. 4 to be described later, the possible target values may include, for example, nine numerical values from 31 to 39. Further, the input part (not shown) used for the user to input the possible target value may be provided. Alternatively, an acquiring part 17 (not shown) to be used to acquire the possible target value via a storage or network (not shown) may be provided. Alternatively, a function of automatically generating the possible target value may be provided, and the possible target value thus automatically generated may be stored in the possible target value storage 18. Further, a function of updating the possible target value at a predetermined timing or the like may be provided, and the possible target value thus updated may be stored in the possible target value storage 18.

The output predicting part 19 predicts the output value of the intermediate product 5 for each possible target value based on the target value of the intermediate product 5 and the output value of the intermediate product 5 in the past manufacturing data. A predicting method implemented in the output predicting part 19 may be linear regression or linear regression with regularization, or may be nonlinear regression such as k-nearest neighbor algorithm, random forest, neural network, or Gaussian process regression. Further, an average value c of differences between a target value $x_i$ of the intermediate product 5 and an output value $z_i$ of the intermediate product 5 may be calculated with, for example, the following equation (1), and an output $\hat{z}$ of a possible target value x may be predicted by using, for example, the following equation (2). Note that, herein, variables and the like represented by symbols having ^ attached thereon are denoted as symbols having ^ attached to a right side thereof.

$$c = \frac{1}{n}\sum_{i=1}^{n}(z_i - x_i) \quad (1)$$

$$\hat{z} = x + c \quad (2)$$

The output predicting part 19 may predict a variation (standard deviation) in the output value of the intermediate product 5 for each possible target value based on the target value and output value of the intermediate product 5. For example, a standard deviation of the output value of the intermediate product 5 for each possible target value may be used as a predicted value of the output value of the intermediate product. Alternatively, with a predicted value $\hat{z}=f(x)$ of the output value for each possible target value x, a standard deviation of a prediction residual $e_i=z_i-f(x_i)$ of the output value of the intermediate product 5 may be used as a predicted value of the standard deviation of the output value of the intermediate product 5.

Further, when the output value of the intermediate product 5 is predicted by Gaussian process regression, not only the predicted value of the output value of the intermediate product 5 but also the standard deviation can be obtained at the same time, and thus the standard deviation thus obtained may be used as the predicted value of the standard deviation of the output value of the intermediate product 5.

The quality predicting part 20 predicts the quality of the final product 6 from the output value of the intermediate product 5 predicted by the output predicting part 19 for each possible target value of the intermediate product 5, based on the output value of the intermediate product 5 and the quality of the final product 6 in the past manufacturing data.

The quality predicting part 20 first calculates, based on an output value $z_i$ of an i-th intermediate product 5 and quality $y_i$ of the final product 6, quality $\hat{y}$ of the final product 6 from the output value $z_i$ of the intermediate product 5 with the following equation (3).

$$\hat{y}=g(z) \quad (3)$$

Next, the output value of the intermediate product 5 for each possible target value x is predicted with the following equation (4).

$$\hat{z}=f(x) \quad (4)$$

From equations (3) and (4), the quality $\hat{y}$ of the final product 6 for each possible target value x is calculated with the following equation (5).

$$\hat{y}=g(\hat{z})=g(f(x)) \quad (5)$$

In a method of predicting the quality of the final product 6 from the output value of the intermediate product 5, the output of the intermediate product 5 is split into m intervals such as $[-\infty, d_1]$, $[d_1, d_2]$, and up to $[d_{m-1}, \infty]$, an average value $\mu_k$ of the quality of the final product 6 with the output of the intermediate product 5 lying in each interval is calculated with the following equation (6), and then a value calculated with equation (6) may be used as the predicted value of the quality.

$$\mu_k = \frac{1}{n_k}\sum_{i:z_i\in[d_{k-1},d_k]}y_i \quad (6)$$

$n_k$ in equation (6) represents the number of i such that $z_i \in [d_{k-1}, d_k]$. The quality may be predicted by using linear regression or linear regression with a regularization term, or may be predicted by using non-linear regression such as k-nearest neighbor algorithm, random forest, neural network, or Gaussian process regression.

The quality predicting part 20 may predict a risk in the quality of the final product 6 for each possible target value from the predicted value of the output value of the intermediate product 5 for each possible target value based on the output value of the intermediate product 5 and the quality of the final product 6. The risk in the quality of the final product 6 may be determined based on a predicted value $\hat{\sigma}$ of the standard deviation of the quality of the final product 6 for each possible target value. Further, the risk in the quality of the final product 6 may be determined based on the sum of or difference between the predicted value $\hat{y}$ of the quality of the final product 6 for each possible target value and a value resulting from weighting the predicted value $\hat{\sigma}$ of the standard deviation of the quality. For example, the risk may be calculated with the following equation (7) where w represents the weight.

$$\hat{y}-w\hat{\sigma} \quad (7)$$

Examples of a method of predicting the standard deviation of the final product 6 for each possible target value of the intermediate product 5 include a method of predicting a standard deviation h(z) of the quality of the final product 6 for each output value z of the intermediate product 5. In this method, a standard deviation $h(\hat{z})$ of the quality of the final product 6 corresponding to the predicted value $\hat{z}$ of the output value of the intermediate product 5 for each possible target value of the intermediate product 5 may be used as a predicted value of the standard deviation of the quality of the final product 6 for each target value of the intermediate product 5. Further, when a predicted value $\hat{s}$ of the standard deviation of the output value of the intermediate product 5 for each possible target value of the intermediate product 5 is calculated, p random numbers r whose average is 0 and that follow a normal distribution having a standard deviation $\hat{s}$ are generated for each possible target value of the intermediate product 5, and when the output value of the intermediate product 5 is equivalent to the sum of the predicted value f(x) of the output value and the random number r, a standard deviation of a predicted value g(f(x)+r) of the quality of the final product 6 is calculated and the calculated value may be used as the predicted value of the standard deviation of the quality of the final product 6.

The quality predicting part 20 may include an expected value predicting part 20a and a risk predicting part 20b. The expected value predicting part 20a predicts an expected value of the quality of the final product 6 for each possible target value. The risk predicting part 20b predicts a risk of deteriorating the quality of the final product 6 for each possible target value.

The possible target value storage 18 may store the plurality of possible target values. In this case, the output predicting part 19 predicts the output value of the intermediate product 5 for each of the plurality of possible target values. Further, the expected value predicting part 20a predicts the expected value of the quality of the final product 6 for each of the plurality of possible target values. Further, the risk predicting part 20b predicts the risk of deteriorating the quality of the final product 6 for each of the plurality of possible target values.

FIG. 4 is a diagram showing a correspondence among the possible target value, the expected value of the quality of the final product 6, and the risk in the quality of the final product 6. The output predicting part 19 generates the correspondence as shown in FIG. 4.

Figure 5:
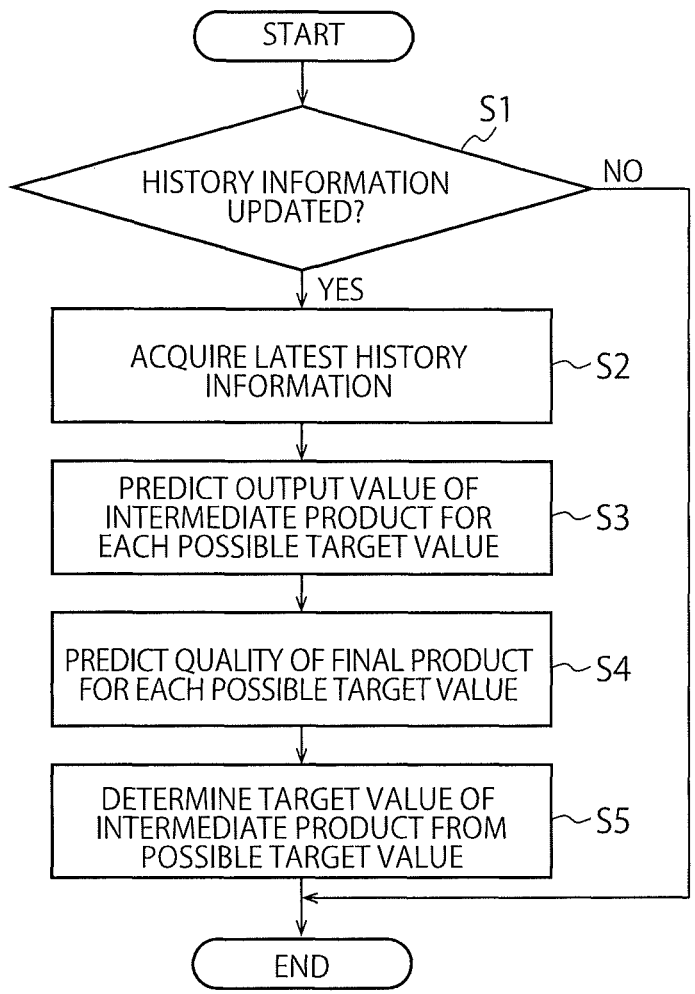
FIG. 5 is a flowchart showing a processing operation of the manufacturing control apparatus according to the present embodiment.

FIG. 5 is a flowchart showing a processing operation of the manufacturing control apparatus 1 according to the present embodiment. The flowchart shown in FIG. 5 may be executed every predetermined period, may be executed at timing when each processing apparatus 11 starts processing the raw material, or may be executed in accordance with a user's instruction.

First, determination is made of whether the history information stored in the history information storage 16 has been updated (step S1). When the history information has not been updated, the processing shown in FIG. 5 is terminated. When the history information has been updated, the acquiring part 17 acquires the latest history information (step S2). The history information acquired by the acquiring part 17 is information in which the target value of the intermediate product 5 used by the processing controller 15 to control the plurality of processing apparatuses 11, the output value of the intermediate product 5, and the quality of the final product 6 are associated with each other.

Next, the output predicting part 19 predicts the output value of the intermediate product 5 for each possible target value of the intermediate product 5 (step S3). Next, the quality predicting part 20 predicts the quality of the final product 6 for each possible target value of the intermediate product 5 (step S4).

Next, the target value determining part 14 determines the target value of the intermediate product 5 from the possible target values (step S5). In this step S5, the target value of the intermediate product 5 may be determined based on the predicted value of the quality of the final product 6 for each possible target value. Alternatively, a possible target value with the best predicted value of the quality of the final product 6 may be determined as the target value of the intermediate product 5. The target value thus determined may be input to the control apparatus by the user or may be transmitted to the control apparatus via predetermined communication means.

Thus, according to the first embodiment, the output value of the intermediate product 5 is predicted based on the target value of the intermediate product 5 and the output value of the intermediate product 5, and the quality of the final product 6 is predicted from the predicted value of the output value of the intermediate product 5. Accordingly, the quality of the final product 6 can be accurately predicted, controlling the target value of the intermediate product 5 to increase the quality of the final product 6 allows the output value of the intermediate product 5 to be closer to the target value of the intermediate product 5, and as a result, the quality of the final product 6 can be increased.

Second Embodiment

According to a second embodiment, the output predicting part 19 and the quality predicting part 20 predict a probability distribution.

Figure 6:
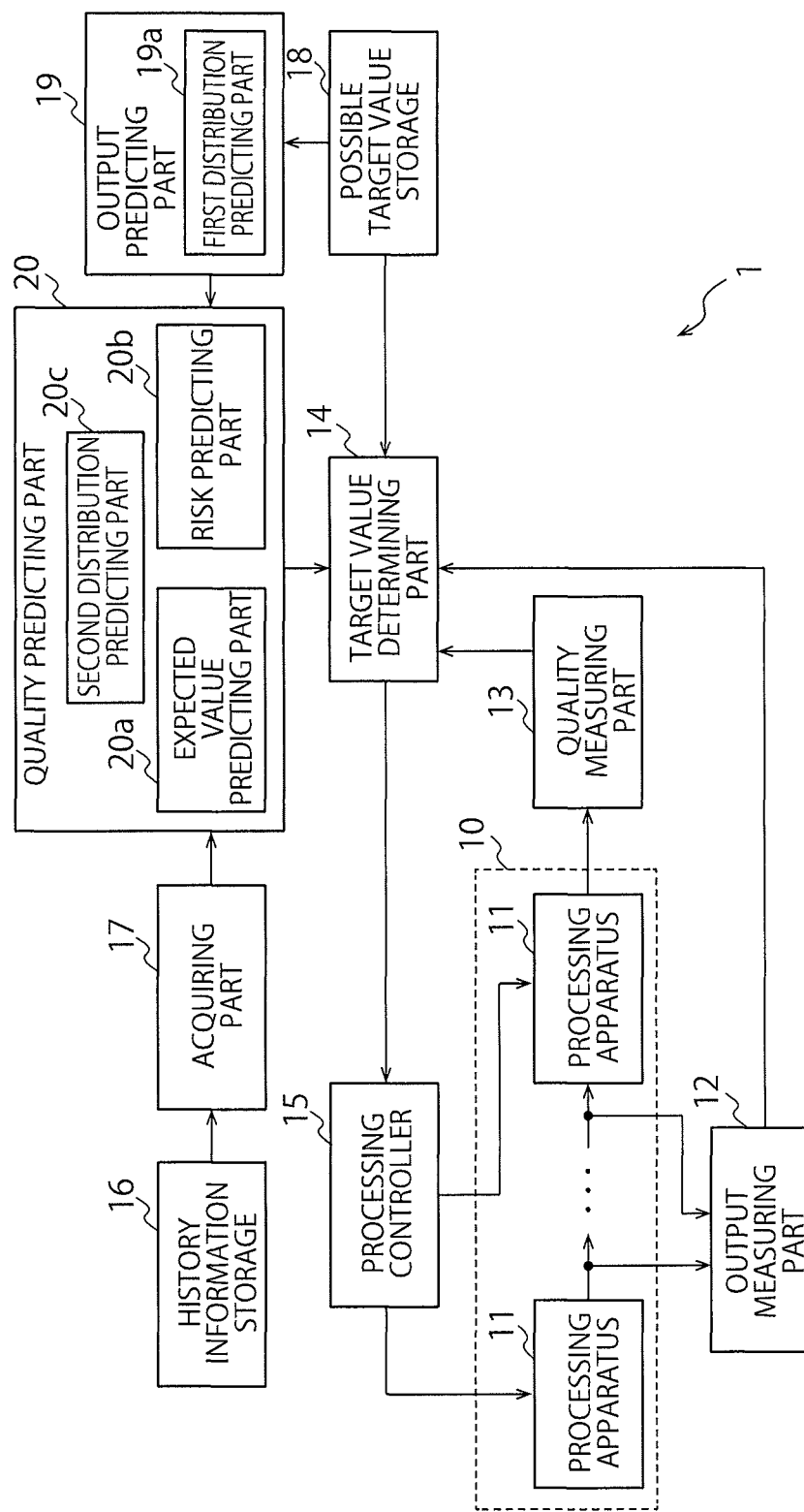
FIG. 6 is a block diagram of a manufacturing control apparatus according to a second embodiment.

FIG. 6 is a block diagram of a manufacturing control apparatus 1 according to the second embodiment. The manufacturing control apparatus 1 shown in FIG. 6 differs from the manufacturing control apparatus 1 shown in FIG. 2 in the processing operations of the output predicting part 19 and the quality predicting part 20.

The output predicting part 19 shown in FIG. 6 includes a first distribution predicting part 19a. The first distribution predicting part 19a predicts a probability distribution of the output value of the intermediate product 5 for each of the plurality of possible target values. For example, when calculating the predicted value $\hat{z}$ of the output value of the intermediate product 5 and a variation (standard deviation) $\hat{s}$ for each possible target value, the output predicting part 19 calculates the probability distribution of the output value of the intermediate product 5 for each possible target value. This probability distribution may be a normal distribution having the average value $\hat{z}$ and standard deviation $\hat{s}$ of the predicted value of the output value of the intermediate product 5. Alternatively, when Gaussian process regression is used to predict the output value of the intermediate product 5, the normal distribution of the Gaussian process regression may be used as the probability distribution of the output value of the intermediate product 5. Alternatively, on the assumption that the output value of the intermediate product 5 for each possible target value is normally distributed, the maximum likelihood estimation may be performed for each possible target value using the output value of the intermediate product 5. Further, instead of the normal distribution, a log-normal distribution, an exponential distribution, a Weibull distribution, a gamma distribution, a uniform distribution, a beta distribution, or the like may be used.

The quality predicting part 20 includes a second distribution predicting part 20c that predicts, for each output value of the intermediate product 5, a probability distribution of a corresponding quality of the final product 6. The risk predicting part 20b in the quality predicting part 20 predicts, based on the probability distribution of the output value of the intermediate product 5 and the probability distribution of the corresponding quality of the final product 6, the probability distribution of the quality of the final product 6 for each possible target value.

The second distribution predicting part 20c predicts the probability distribution of the quality of the final product 6 for each output value of the intermediate product 5. For example, when the quality predicting part 20 calculates the predicted value $\hat{y}$ of the quality of the final product 6 and variation (standard deviation) $\hat{\sigma}$ for each output value of the intermediate product 5, the probability distribution of the quality of the final product 6 for each output value of the intermediate product 5 may be used as a normal distribution having an average $\hat{y}$ and standard deviation $\hat{\sigma}$ of the quality of the final product 6. Alternatively, when Gaussian process regression is used to predict the quality of the final product 6, the normal distribution of output of the Gaussian process regression may be predicted as the probability distribution of the quality of the final product 6. Alternatively, the output value of the intermediate product 5 is split into m intervals such as [−∞, d1], [d1, d2], and up to [dm−1, ∞], and then the maximum likelihood estimation may be performed for each interval using data of the quality of the final product 6 with the output value of the intermediate product 5 lying in each interval, on the assumption that the quality of the final product 6 is normally distributed. Further, instead of the normal distribution, a log-normal distribution, an exponential distribution, a Weibull distribution, a gamma distribution, a uniform distribution, a beta distribution, or the like may be used.

The risk predicting part 20b combines a probability distribution P(z|x) of the output value of the intermediate product 5 with a probability distribution P(y|z) of the quality of the final product 6 to predict a probability distribution P(y|x) of the quality of the final product 6 for each possible target value x. Specifically, the probability distribution P(y|x) of the quality of the final product 6 for each possible target value x is predicted based on the following equation (8).

$$P_{y|x}(y \le y_0) = \sum_{k=1}^{m} P_{z|x}(d_{k-1} \le z \le d_k) P_{y|z}(y \le y_0) \quad (8)$$

Figure 7:
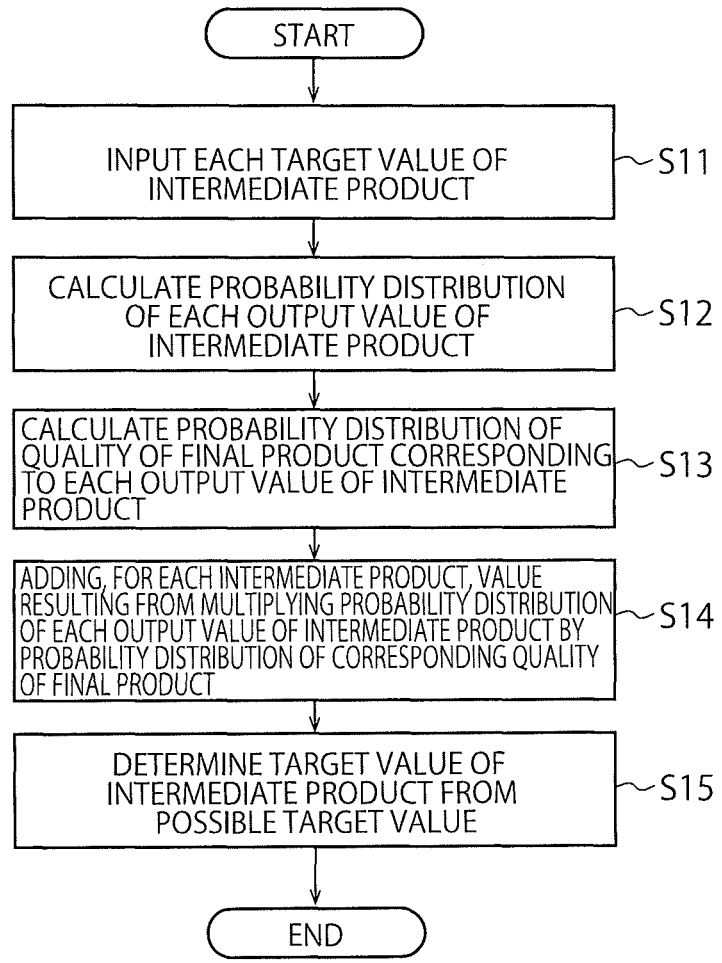
FIG. 7 is a flowchart showing a processing operation of the manufacturing control apparatus according to the second embodiment.

FIG. 7 is a flowchart showing a processing operation of the manufacturing control apparatus 1 according to the second embodiment. First, each target value of the intermediate product 5 is input (step S11). Next, the probability distribution of each output value of the intermediate product 5 is calculated (step S12). Next, the probability distribution of the quality of the final product 6 corresponding to each output value of the intermediate product 5 is calculated (step S13). Next, a value resulting from multiplying the probability distribution of each output value of the intermediate product 5 by the probability distribution of the corresponding quality of the final product 6 is added for each intermediate product 5 in accordance with the above-described equation (8) (step S14). Next, the probability distribution of the quality of the final product 6 corresponding to the possible target value of the intermediate product 5 is predicted based on the calculation result of step S13 (step S15).

As described above, according to the second embodiment, the probability distribution of the quality of the final product 6 for each possible target value of the intermediate product 5 is predicted by combining the probability distribution of the output value of the intermediate product 5 with the probability distribution of the quality of the final product 6. This makes it possible to accurately predict how much the quality of the final product 6 changes when the target value of the intermediate product 5 changes and thus to correctly set the target value of the intermediate product 5.

Third Embodiment

According to a third embodiment, a function of outputting the quality of the final product 6 is added to the manufacturing control apparatus 1 according to the first or second embodiment.

Figure 8:
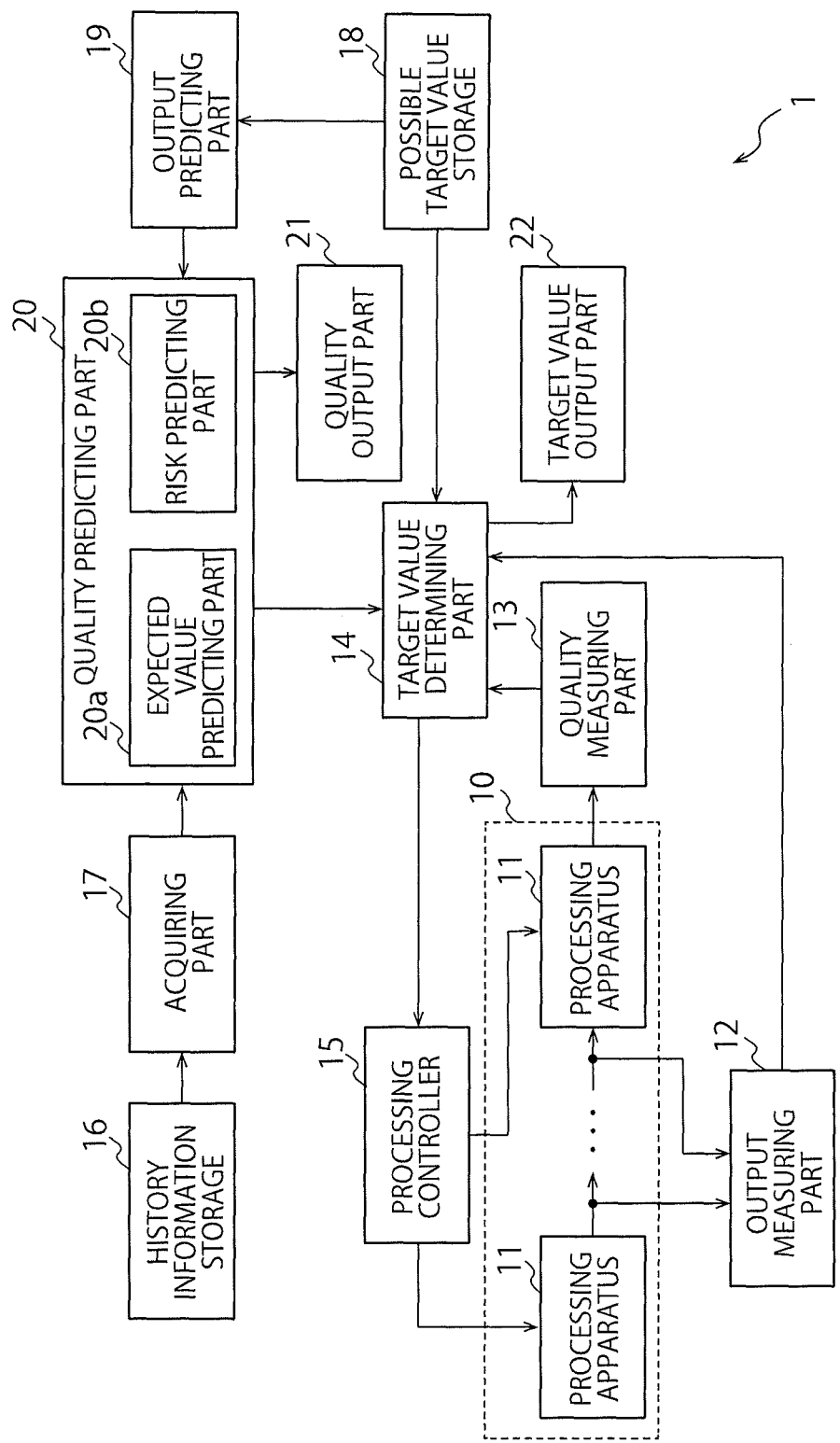
FIG. 8 is a block diagram of a manufacturing control apparatus according to a third embodiment.

FIG. 8 is a block diagram of a manufacturing control apparatus 1 according to the third embodiment. The manufacturing control apparatus 1 shown in FIG. 8 is equivalent to a manufacturing control apparatus resulting from adding a quality output part 21 to the manufacturing control apparatus shown in FIG. 6. Note that the quality output part 21 may be added to the manufacturing control apparatus 1 shown in FIG. 2.

The quality output part 21 outputs the predicted value of the quality of the final product 6 for each of the plurality of possible target values. The form of output of the quality output part 21 is not limited to any specific form. For example, the predicted value of the quality of the final product 6 may be output in the form of a graph or the like or may be output in the form of a table containing numerical values.

Figure 9:
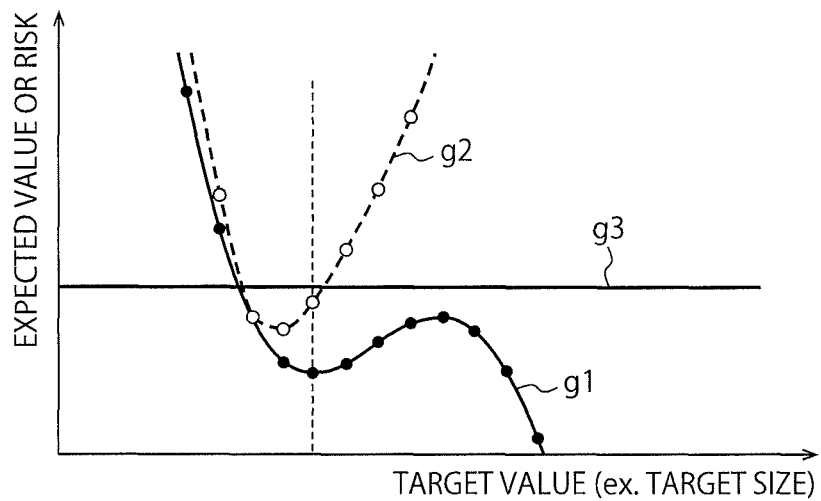
FIG. 9 is a diagram showing another example of output of a quality output part.

FIG. 9 is a diagram showing an example of the output from the quality output part 21, specifically a diagram showing an example where the quality output part 21 outputs a graph g1 representing the expected value of the quality of the final product 6 for each possible target value of the intermediate product 5 and a graph g2 representing the predicted value of the risk in the quality of the final product 6 for each possible target value. A horizontal axis of FIG. 9 represents the target value of the intermediate product 5, and a vertical axis represents the expected value or magnitude of the risk. The expected value of the quality of the final product 6 shown in FIG. 9 is, for example, a predicted value of a defect rate, and the target value of the intermediate product 5 is, for example, a target size.

In FIG. 9, the smaller the value on the vertical axis of the graph g1 representing the expected value of the quality of the final product 6 is, the greater the expected value becomes, that is, the smaller the defect rate becomes. Further, in the graph g2 representing the predicted value of the risk, the smaller the value on the vertical axis is, the smaller the risk becomes.

The risk needs to be kept within a predetermined risk constraint range (horizontal line g3 shown in FIG. 9). Being kept within the risk constraint range means that the risk is suppressed within a range smaller than the horizontal line g3 shown in FIG. 9. The target value determining part 14 selects the target value of the intermediate product 5 such that the expected value of the quality of the final product 6 becomes the maximum on the condition that the risk is within the risk constraint range. In the case of FIG. 9, the target value of the intermediate product 5 represented by the broken line is selected.

Figure 10:
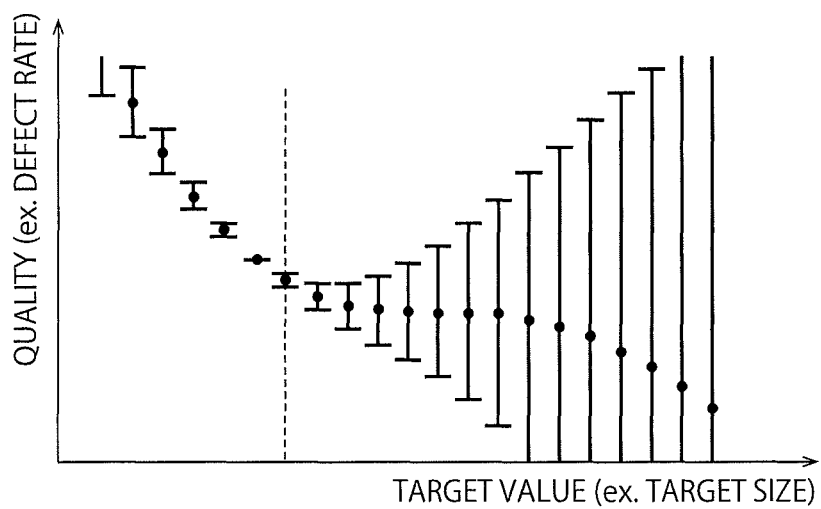
FIG. 10 is a diagram showing another example of the output of the quality output part.

FIG. 10 is a diagram showing another example of the output from the quality output part 21, specifically a diagram showing an example where a prediction result of the probability distribution of the quality of the final product 6 for each possible target value of the intermediate product 5 is output in the form of a graph. A horizontal axis of FIG. 10 represents the target value of the intermediate product 5, for example, a target size. A vertical axis represents a value resulting from converting the probability distribution of the quality of the final product 6 into a numerical form. Each error bar represents magnitude of variation in the probability distribution, that is, a standard deviation. A plot on each error bar represents the expected value of the probability distribution.

The target value determining part 14 determines the target value of the intermediate product 5 such that the magnitude of variation in the probability distribution of the quality, that is, a length of the error bar is equal to or less than a predetermined value, and the expected value of the quality is as large as possible, as represented by the broken line in FIG. 10.

The target value determining part 14 determines the target value from the possible target values based on the quality of the final product 6 for each possible target value of the intermediate product 5. For example, a possible target value with the best quality of the final product 6 for each possible target value of the intermediate product 5 may be determined as the target value. Alternatively, when the risk in the quality of the final product 6 is also predicted, a possible target value that makes the expected value of the quality of the final product 6 maximum among possible target values having a risk in the quality of the final product 6 lying within a certain constraint may be determined as the target value of the intermediate product 5. More specifically, possible target values having a risk in the quality of the final product 6 greater (smaller) than a certain threshold specified by the user are selected, and among the possible target values, a possible target value with the best quality of the final product 6 predicted may be determined as the target value.

Further, the user himself/herself may determine the target value based on the graph shown in FIG. 9 or FIG. 10 output by the quality output part 21.

A target value output part 22 may be added to the manufacturing control apparatus 1 shown in FIG. 8. The target value output part 22 outputs the target value determined by the target value determining part 14. This target value output part 22 may be added to the manufacturing control apparatus 1 shown in FIG. 2.

As described above, according to the third embodiment, since the predicted value of the quality of the final product 6 is output for each of the plurality of possible target values, the target value of the intermediate product 5 is easily determined. For example, the correspondence between the possible target value of the intermediate product 5 and the risk in the quality of the final product 6 is represented in a graph, and the correspondence between the possible target value of the intermediate product 5 and the expected value of the quality of the final product 6 is represented in a graph, thereby allowing the target value of the intermediate product 5 to be easily determined such that the expected value of the quality becomes maximum while the risk is suppressed within the risk constraint range.

Fourth Embodiment

A fourth embodiment differs from the first to third embodiments in the processing operation of the target value determining part 14. The target value determining part 14 according to the fourth embodiment can be replaced with the target value determining part 14 according to the first to third embodiments.

The target value determining part 14 determines, based on the quality of the final product 6 for each possible target value of the intermediate product 5, the target value from the possible target values of the intermediate product 5 using reinforcement learning or bandit algorithm.

For example, the target value may be determined from the possible target values of the intermediate product 5 using $\varepsilon$-greedy algorithm. According to a uniform distribution in the interval from 0 to 1, a random number g is generated as shown in the following equation (9):

$$g = \text{rand}(0, 1) \qquad (9).$$

Next, determination is made of whether the random number g thus generated is equal to or greater than a predetermined value $\varepsilon$. When $g \geq \varepsilon$ is satisfied, that is, the random number g is equal to or greater than $\varepsilon$, a possible target value with the best quality of the final product 6 predicted is selected as the target value. When the random number g is less than $\varepsilon$, that is, $g < \varepsilon$ is satisfied, one target value is selected at random from the possible target values.

For example, when the value of $\varepsilon$ is 0.1, a possible target value is selected at random with a probability of 10%, and a possible target value with the best quality of the final product 6 predicted is selected with a probability of 90%.

As described above, selecting a possible target value at random with a certain probability makes effective learning possible with the possibility of selecting from a wide range of possible target values kept. Here, a possible target value is selected at random from all the possible target values, but the possible target value may be selected at random from possible target values other than the possible target value with the best quality of the final product 6 predicted.

Alternatively, a target value may be determined from the possible target values using Thompson sampling. When the quality predicting part 20 that predicts the quality of the final product 6 predicts the probability distribution of the quality of the final product 6 for each possible target value, a random number gx corresponding to the probability distribution is generated for each possible target value x. A possible target value with the best random number gx for each possible target value is selected as the target value.

Alternatively, in order to determine the target value from the possible target values of the intermediate product 5, the UCB method may be used, or an optimization method, reinforcement learning, or bandit algorithm may be used.

As described above, according to the fourth embodiment, it is possible to determine the best target value with the possibility of selecting each of the plurality of possible target values of the intermediate product 5 kept.

At least some of the manufacturing control apparatus 1 described in the above-described embodiments may be implemented with hardware or software. When the implementation is made with software, a program for implementing at least some of functions of the manufacturing control apparatus 1 may be stored in a recording medium such as a flexible disk or a CD-ROM and read and executed by a computer. The recording medium is not limited to a removable medium such as a magnetic disk or an optical disc, but may be a fixed recording medium such as a hard disk device or a memory.

Further, the program for implementing at least some of the functions of the manufacturing control apparatus 1 may be distributed via a communication line (including wireless communication) such as the Internet. Further, the program that has been encrypted, modulated, or compressed may be distributed via a wired line or wireless line such as the Internet or distributed with the program stored in a recording medium.

While certain embodiments have been described, these embodiments have been presented by way of example only, and are not intended to limit the scope of the invention. The novel embodiments may be embodied in a variety of other forms; furthermore, various omissions, substitutions and changes may be made without departing from the spirit of the invention. The embodiments and modifications of the embodiments fall within the scope and spirit of the invention and further fall within the invention claimed in the claims and equivalents of the claims.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A manufacturing control apparatus that controls an output value of an intermediate product of a semiconductor device produced in a plurality of manufacturing processes of a semiconductor manufacturing apparatus, the manufacturing control apparatus comprising processing circuitry:
wherein the processing circuitry is configured to:
acquire past manufacturing data in which a target value of an output value of the intermediate product, the output value of the intermediate product, and quality of the semiconductor device being a final product produced from the manufacturing apparatus are associated with one another;
predict, based on the target value of the intermediate product and the output value of the intermediate product in the past manufacturing data, the output value of the intermediate product for each of possible target values of the intermediate product;
predict, based on the output value of the intermediate product and the quality of the final product in the past manufacturing data, the quality of the final product from a predicted value of the output value of the intermediate product for each of the possible target values;
control a processing condition of a processing apparatus in each of the plurality of manufacturing processes to make the output value of the intermediate product closer to a target value, and
determine, from the plurality of possible target values and based on a predicted value of the quality of the final product for each of the plurality of possible target values, the target value of the intermediate product associated with a best predicted value of the final product, wherein
the quality of the final product includes at least one of shape, size or property of the final product; and
the target value of the intermediate product includes a numerical value of at least one of shape, size or property of the intermediate product.

2. The manufacturing control apparatus according to claim 1, wherein to predict the quality of the final product, the processing circuitry is configured to:
predict an expected value of the quality of the final product for each of the possible target values, and
predict a risk of deteriorating the quality of the final product for each of the possible target values.

3. The manufacturing control apparatus according to claim 2, wherein
the processing circuitry is further configured to store the plurality of possible target values of the intermediate product, wherein
the output value of the intermediate product is predicted for each of the plurality of possible target values,
the expected value of the quality of the final product is predicted for each of the plurality of possible target values, and
the risk of deteriorating the quality of the final product is predicted for each of the plurality of possible target values.

4. The manufacturing control apparatus according to claim 1, wherein
the target value of the intermediate product is determined from the plurality of possible target values based on at least one of reinforcement learning or a bandit algorithm.

5. A manufacturing control method of controlling an output value of an intermediate product of a semiconductor device produced in each of a plurality of manufacturing processes of a semiconductor manufacturing apparatus, the manufacturing control method comprising:
acquiring past manufacturing data in which a target value of an output value of the intermediate product, the output value of the intermediate product, and quality of the semiconductor device being a final product produced from the manufacturing apparatus are associated with each other;
predicting, based on the target value of the intermediate product and the output value of the intermediate product in the past manufacturing data, the output value of the intermediate product for each of possible target values of the intermediate product;
predicting, based on the output value of the intermediate product and the quality of the final product in the past manufacturing data, the quality of the final product from a predicted value of the output value of the intermediate product for each of the possible target values predicted in the predicting the output value;
controlling a processing condition of a processing apparatus in each of the plurality of manufacturing processes to make the output value of the intermediate product closer to a target value, and
determining, from the plurality of possible target values and based on a predicted value of the quality of the final product for each of the plurality of possible target values, the target value of the intermediate product associated with a best predicted value of the final product, wherein
the quality of the final product includes at least one of shape, size or property of the final product, and
the target value of the intermediate product includes a numerical value of at least one of shape, size or property of the intermediate product.

6. The manufacturing control method according to claim 5, wherein
the predicting the quality comprises
predicting an expected value of the quality of the final product associated with a best predicted value of the final product, and
predicting a risk of deteriorating the quality of the final product associated with a best predicted value of the final product.

7. The manufacturing control method according to claim 6, further comprising
storing the plurality of possible target values of the intermediate product, wherein
the predicting the output value comprises predicting the output value of the intermediate product for each of the plurality of possible target values,
the predicting the expected value comprises predicting the expected value of the quality of the final product for each of the plurality of possible target values, and
the predicting the risk comprises predicting the risk of deteriorating the quality of the final product for each of the plurality of possible target values.

8. A non-transitory recording medium recording a program for causing a computer to execute a process of controlling an output value of an intermediate product of a semiconductor device produced in each of a plurality of manufacturing processes of a semiconductor manufacturing apparatus, the program causing the computer to execute:
acquiring past manufacturing data in which a target value of an output value of the intermediate product, the output value of the intermediate product, and quality of the semiconductor device being a final product produced from the manufacturing apparatus are associated with each other;

predicting, based on the target value of the intermediate product and the output value of the intermediate product in the past manufacturing data, the output value of the intermediate product for each of possible target values of the intermediate product;

predicting, based on the output value of the intermediate product and the quality of the final product in the past manufacturing data, the quality of the final product from a predicted value of the output value of the intermediate product for each of the possible target values predicted in the predicting the output value;

controlling a processing condition of a processing apparatus in each of the plurality of manufacturing processes to make the output value of the intermediate product closer to a target value, and determining, from the plurality of possible target values and based on a predicted value of the quality of the final product for each of the plurality of possible target values, the target value of the intermediate product associated with a best predicted value of the final product, wherein the quality of the final product includes at least one of shape, size or property of the final product, and the target value of the intermediate product includes a numerical value of at least one of shape, size or property of the intermediate product.

* * * * *